United States Patent
Lee et al.

(10) Patent No.: US 9,065,071 B2
(45) Date of Patent: Jun. 23, 2015

(54) ORGANIC LIGHT EMITTING DEVICE WITH A PROTECTIVE LAYER INCLUDING AT LEAST ONE OF A NANO-CLAY AND A GRAPHITE OXIDE FORMED ON THE ANODE

(75) Inventors: Kwang Jik Lee, Gyunggi-do (KR); Suk Jin Ham, Seoul (KR); Ji Hyuk Lim, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 687 days.

(21) Appl. No.: 13/288,543

(22) Filed: Nov. 3, 2011

(65) Prior Publication Data

US 2012/0286248 A1 Nov. 15, 2012

(30) Foreign Application Priority Data

May 12, 2011 (KR) ........................ 10-2011-0044393

(51) Int. Cl.
*H01L 29/08* (2006.01)
*H01L 35/24* (2006.01)
*H01L 51/00* (2006.01)
*H01L 51/52* (2006.01)

(52) U.S. Cl.
CPC ........ *H01L 51/5253* (2013.01); *H01L 51/5215* (2013.01)

(58) Field of Classification Search
CPC ............ H01L 27/1214; H01L 51/5237; H01L 29/78603; H01L 27/3244; H01L 51/5253; H01L 51/5215
USPC .................. 257/40, E51.026; 438/46
See application file for complete search history.

(56) References Cited

U.S. PATENT DOCUMENTS 7,288,329 B2 * 10/2007 Zheng et al. .................. 428/690
2004/0225025 A1 * 11/2004 Sullivan et al. ................ 522/71
2010/0090224 A1 4/2010 Lee et al.

FOREIGN PATENT DOCUMENTS

JP 11-297476 10/1999
KR 10-2006-0067085 A 6/2006

OTHER PUBLICATIONS

Machine translation of JP 11-297476 A, Yoshikazu et al., published Oct. 29, 1999 by JPO.*
Korean Office Action, and the English translation thereof, issued in Korean Patent Application No. 10-2011-0044393 dated Jan. 30, 2013.

* cited by examiner

*Primary Examiner* — Stephen W Smoot
*Assistant Examiner* — Vicki B Booker
(74) *Attorney, Agent, or Firm* — McDermott Will & Emery LLP

(57) ABSTRACT

There are provided an organic light emitting diode and a method of manufacturing the same. The organic light emitting diode includes: an anode formed on a substrate; a protective layer having at least one inorganic material layer stacked therein, the at least one inorganic material layer containing at least one of a nano-clay and a graphite oxide; a light emitting polymer layer formed on the protective layer; and a cathode formed on the light emitting polymer layer. In the case of the organic light emitting diode, the injection concentration of holes may be controlled, such that the stability of an element may be improved and the lifespan thereof may be increased.

10 Claims, 4 Drawing Sheets

ORGANIC LIGHT EMITTING DEVICE WITH A PROTECTIVE LAYER INCLUDING AT LEAST ONE OF A NANO-CLAY AND A GRAPHITE OXIDE FORMED ON THE ANODE

CROSS-REFERENCE TO RELATED APPLICATIONS

This application claims the priority of Korean Patent Application No. 10-2011-0044393 filed on May 12, 2011, in the Korean Intellectual Property Office, the disclosure of which is incorporated herein by reference.

BACKGROUND OF THE INVENTION

1. Field of the Invention

The present invention relates to an organic light emitting diode and a method of manufacturing the same allowing for improved stability.

2. Description of the Related Art

An organic light emitting diode (OLED) recently used in the field of displays is a self-luminous display element and has a wide viewing angle, excellent contrast, and a fast response time.

In addition, the organic light emitting diode is excellent in terms of brightness, driving voltage, and response speed characteristics, as compared to an inorganic electro-luminescence (EL) element, and may be polychromed, such that it has been prominent as a display element.

A general organic light emitting diode has a structure in which an anode is formed on an upper portion of a substrate, a light emitting layer in an organic thin film form is formed on the anode, and a cathode is formed on the light emitting layer.

In addition, a hole injection layer or a hole transport layer may be disposed between the anode and the light emitting layer, and an electron injection layer or an electron transport layer may be disposed between the light emitting layer and the cathode.

Here, the hole injection layer, the hole transport layer, the light emitting layer, the electron transport layer, and the electron injection layer are organic thin film layers made of an organic compound.

Polymer OLEDs, since the organic thin film layers thereof are generally stacked through spin coating, may be relatively cheaply manufactured. However, existing lower layers may be removed during the formation of a new layer, such that it may be difficult to form a stack.

In addition, there are common problems in the formation of organic light emitting diode elements.

First, within a polymer organic thin film layer, holes have a moving speed faster than that of electrons, such that imbalance between the number of generated holes and the number of generated electrons may occur.

Second, oxygen or moisture may easily penetrate the organic layers to thereby permeate into the element, thereby deteriorating the performance and the stability of the element.

In addition, in the case of poly(3,4-ethylenedioxythiophene): poly(styrene sulfonate), widely used as a material of the hole injection layer, protrusion due to aging may be frequently generated, such that a short-circuit between electrodes occurs.

SUMMARY OF THE INVENTION

An aspect of the present invention provides an organic light emitting diode and a method of manufacturing the same allowing for improved stability.

According to an aspect of the present invention, there is provided an organic light emitting diode including: an anode formed on a substrate; a protective layer formed on the anode and having at least one inorganic material layer stacked therein, the at least one inorganic material layer containing at least one of a nano-clay and a graphite oxide; a light emitting polymer layer formed on the protective layer; and a cathode formed on the light emitting polymer layer.

The organic light emitting diode may further include a hole injection layer formed between the anode and the protective layer.

The protective layer may further include at least one polymer layer formed alternately with the at least one inorganic material layer.

The nano-clay may be a hydrate containing at least one material selected from a group consisting of sodium, calcium, aluminum, magnesium, a silicon oxide, and a hydroxide.

The protective layer may have a thickness of 15 nm or less.

The hole injection layer may contain poly(3,4-ethylenedioxythiophene) (PEDOT) and contain a water-soluble polymer.

The at least one inorganic material layer and the at least one polymer layer may have opposing polarities.

According to another aspect of the present invention, there is provided a method of manufacturing an organic light emitting diode, the method including: forming an anode on a substrate; forming a protective layer on the anode, the protective layer having at least one inorganic material layer stacked therein, the at least one inorganic material layer containing at least one of a nano-clay and a graphite oxide; and forming a light emitting polymer layer on the protective layer.

The method may further include forming a hole injection layer between the anode and the protective layer.

The forming of the protective layer may include: preparing a solution including charged nano-clay particles; and repeatedly immersing the anode in the solution to thereby form at least one nano-clay layer on the anode.

The forming of the protective layer may include: preparing a solution including charged nano-clay particles; and repeatedly immersing the hole injection layer in the solution to thereby form at least one nano-clay layer on the hole injection layer.

The forming of the protective layer may include alternately forming at least one nano-clay layer and at least one polymer layer.

The forming of the protective layer may include: preparing a first solution including charged nano-clay particles; preparing a second solution including a charged polymer having a polarity opposite to that of the charged nano-clay particles; and repeatedly immersing the hole injection layer in the first and second solutions in an alternating manner to thereby alternately form at least one nano-clay layer and at least one polymer layer on the hole injection layer.

The at least one nano-clay layer and the at least one polymer layer may have opposing polarities.

The repeated immersing of the anode in the solution may further include cleaning the anode using deionized distilled water and drying the anode after immersing the anode in the solution and before reimmersing the anode in the solution.

The repeated immersing of the hole injection layer in the solution may further include cleaning the hole injection layer using deionized distilled water and drying the hole injection layer after immersing the hole injection layer in the solution and before reimmersing the hole injection layer in the solution.

The repeated immersing of the hole injection layer in the solution may further include cleaning the hole injection layer using deionized distilled water and drying the hole injection layer after immersing the substrate in the first solution and before immersing the substrate in the second solution.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
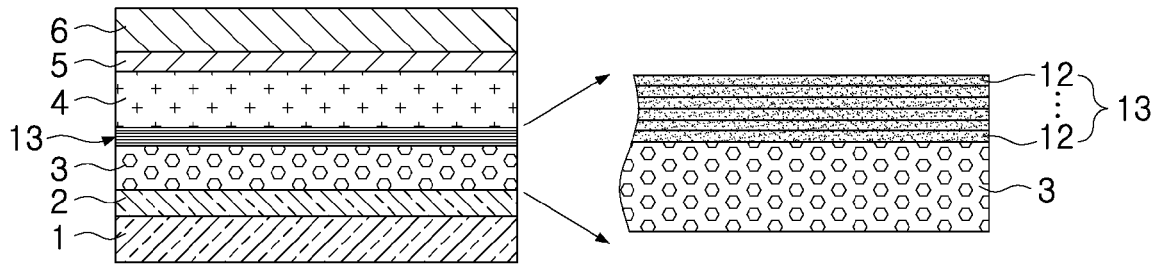
FIG. 1 is a cross-sectional view schematically showing an organic light emitting diode according to an embodiment of the present invention.

Embodiments of the present invention may be modified in many different forms and the scope of the invention should not be limited to the embodiments set forth herein. Rather, these embodiments are provided so that this disclosure will be thorough and complete, and will fully convey the concept of the invention to those skilled in the art. In the drawings, shapes and dimensions may be exaggerated for clarity, and the same reference numerals will be used throughout to designate the same or like components.

Embodiments of the present invention will now be described in detail with reference to the accompanying drawings.

FIG. 1 is a cross-sectional view schematically showing an organic light emitting diode according to an embodiment of the present invention.

Figure 2:
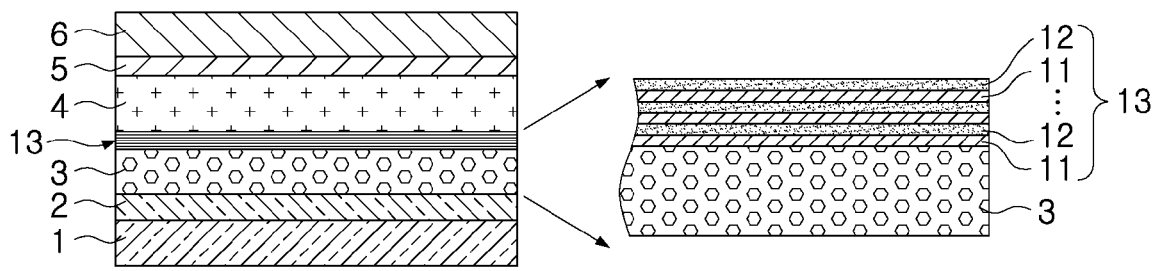
FIG. 2 is a cross-sectional view schematically showing an organic light emitting diode according to another embodiment of the present invention.

FIG. 2 is a cross-sectional view schematically showing an organic light emitting diode according to another embodiment of the present invention.

Figure 3:
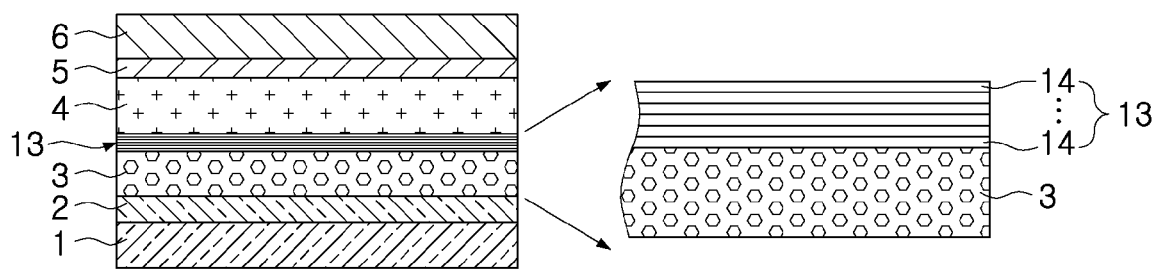
FIG. 3 is a cross-sectional view schematically showing an organic light emitting diode according to another embodiment of the present invention.

FIG. 3 is a cross-sectional view schematically showing an organic light emitting diode according to another embodiment of the present invention.

An organic light emitting diode according to an embodiment of the present invention includes an anode formed on a substrate; a protective layer formed on the anode and having at least one inorganic material layer stacked therein, the inorganic material layer containing at least one of a nano-clay and a graphite oxide; a light emitting polymer layer formed on the protective layer; and a cathode formed on the light emitting polymer layer.

The protective layer may further include at least one polymer layer formed alternately with the inorganic material layer.

Referring to FIG. 1, an organic light emitting diode 10 according to an embodiment of the present invention may include an anode 2 formed on a substrate 1; a protective layer 13 formed on the anode 2 and having at least one nano-clay layer 12 stacked therein; a light emitting polymer layer 4 formed on the protective layer 13; and a cathode 6 formed on the light emitting polymer layer 4.

The organic light emitting diode 10 may further include a hole injection layer 3 formed between the anode 2 and the protective layer 13.

A material of the substrate 1 is not specifically limited but may be selected from a glass, a crystal, a ceramic, a transparent plastic, a synthetic resin, or the like.

The anode 2 is formed on the substrate 1 and serves to supply holes when it is connected to an appropriate potential.

A material of the anode 2 is not specifically limited but may be an oxide doped with various metals, for example, at least one selected from a group consisting of zinc oxide (ZnO), gold (Au), sliver (Ag), palladium (Pd), silicon (Si), or the like.

The organic light emitting diode 10 according to the embodiment of the present invention may include the protective layer 13 formed on the anode 2 and having at least one nano-clay layer 12 stacked therein.

A nano-clay of the nano-clay layer 12 is not specifically limited but may be a hydrate containing at least one selected from a group consisting of sodium, calcium, aluminum, magnesium, a silicon oxide, and a hydroxide.

Particularly, the nano-clay may be a montmorillonite.

The holes supplied from the anode 2 may have a moving speed faster than that of electrons supplied from the cathode 6, such that imbalance between the number of holes and the number of electrons may be generated within the light emitting polymer layer 4.

According to the embodiment of the present invention, the nano-clay layer 12, which is made of an inorganic material, serves as a blocking film blocking the holes, whereby the injection of the holes supplied from the anode 2 may be quantitatively controlled.

In addition, according to the embodiment of the present invention, the nano-clay layer 12 is formed on the anode 2, such that oxygen or moisture may not easily penetrate the nano-clay layer 12. Therefore, the nano-clay layer 12 prevents oxygen or moisture from permeating into an element.

The protective layer 13 having the at least one nano-clay layer 12 stacked therein may have a thickness of, for example, 15 nm or less. However, the thickness of the protective layer 13 is not specifically limited.

Therefore, even though the nano-clay layer may have a multi-layer form, it is a thin film, such that it does not completely block the holes and may allow for control of the injection of the holes.

In addition, in order to more effectively control the injection of the holes, the protective layer 13 may have a thickness of 10 nm or less.

When the thickness of the protective layer 13 exceeds 15 nm, a problem in which the protective layer 13 completely blocks the holes may be generated.

The number of nano-clay layers may change according to an object of the present invention, and is not specifically limited but may be, for example, 1 to 15.

The nano-clay, particularly, the montmorillonite, has a flat panel structure, a thickness of about 1 nm, and an average surface area of about 300 to 600 $nm^2$.

Therefore, the nano-clay having the flat panel structure has a high aspect ratio to thereby have excellent hole blocking capabilities.

The hole injection layer 3 may be formed between the anode 2 and the protective layer 13. A material of the hole injection layer 3 is not specifically limited but may be poly (3,4-ethylenedioxythiophene).

The hole injection layer 3 may further contain a water-soluble polymer material such as polystyrene sulfonate.

The organic light emitting diode 10 according to the embodiment of the present invention may include the protective layer 13 formed between the hole injection layer 3 and the light emitting polymer layer 4 and having the at least one nano-clay layer 12 stacked therein.

When poly(3,4-ethylenedioxythiophene): polystyrene sulfonate (PEDOT: PSS) is used as the material of the hole injection layer 3, the hole injection layer 3 protrudes due to aging, whereby a short-circuit may be caused.

According to the embodiment of the present invention, the protective layer 13 having the at least one nano-clay layer 12 stacked therein is formed between the hole injection layer 3 and the light emitting polymer layer 4, such that the protrusion of the hole injection layer 3 due to aging is prevented, whereby stability may be improved.

The light emitting polymer layer 4 may be formed on the protective layer 13. A material of the light emitting polymer layer 4 is not specifically limited but may be, for example, poly(p-phenylene vinylene) (PPV).

Meanwhile, the organic light emitting diode 10 according to the embodiment of the present invention may further include the electron transport layer 5 formed on the light emitting polymer layer 4.

The cathode 6 is used to inject electrons into the light emitting polymer layer 4. The electrons move to the light emitting polymer layer 4 through the electron transport layer 5.

Referring to FIG. 2, the organic light emitting diode 10 according to an embodiment of the present invention may further include at least one polymer layer 11 formed alternately with the nano-clay layer 12 between the hole injection layer 3 and the light emitting polymer layer 4.

The nano-clay layer 12 and the polymer layer 11 may have opposing polarities.

The charged polymer layer 11 may have a polarity opposite to that of the nano-clay layer 12 and the hole injection layer 3 so that it may be electromagnetically coupled to the nano-clay layer 12 and the hole injection layer 3.

The protective layer 13 further including the at least one polymer layer 11 formed alternately with the nano-clay layer 12 may have a thickness of 15 nm or less.

In addition, in order to more effectively control the injection of the holes, the protective layer 13 may have a thickness of 10 nm or less.

When the thickness of the protective layer 13 exceeds 15 nm, a problem in which the protective layer 13 completely blocks the holes may occur.

As a result, the polymer layer 11 may serve to connect the nano-clay layer 12 and the hole injection layer 3 to each other by being disposed therebetween.

Referring to FIG. 3, an organic light emitting diode 10 according to another embodiment of the present invention may include an anode 2 formed on a substrate 1; a protective layer 13 formed on the anode 2 and having at least one graphite oxide layer 14 stacked therein; a light emitting polymer layer 4 formed on the protective layer 13; and a cathode 6 formed on the light emitting polymer layer 4.

The organic light emitting diode 10 according to this embodiment of the present invention is the same as the organic light emitting diode 10 according to the above-mentioned embodiment of the present invention except that it includes the protective layer 13 formed on the anode 2 and having the at least one graphite oxide layer 14 stacked therein.

The graphite oxide is closer to a flat panel structure than the nano-clay, such that oxygen or moisture may not easily penetrate the graphite oxide layer. Therefore, the graphite oxide layer prevents oxygen or moisture from permeating into an element.

The protective layer 13 including the at least one graphite oxide layer 14 may have a thickness of 15 nm or less.

Therefore, even though the graphite oxide layer 14 may have a multi-layer form, it is a thin film, such that it does not completely block the holes and may allow for control of the injection of the holes.

The graphite oxide layer 14 may be generally formed as a thin film having a thickness of 3 nm or less. However, according to the embodiment of the present invention, the graphite oxide layer 14 may have a thickness of 1 nm or less, such that it does not completely block the holes and may control the injection of the holes.

The number of graphite oxide layers 14 may change according to an object of the present invention, and is not specifically limited but may be, for example, 1 to 15.

When the protective layer 13, including the graphite oxide layer 14, has an overall thickness of less than 1 nm, it may not have a hole blocking effect, and when it has an overall thickness exceeding 15 nm, it may completely block the holes.

A method of forming the graphite oxide layer 14 is not specifically limited but may be, for example, a spin coating method.

According to the embodiment of the present invention, the protective layer 13 having the at least one graphite oxide layer 14 stacked therein is formed between the hole injection layer 3 and the light emitting polymer layer 4, such that the protrusion of the hole injection layer 3 due to aging is prevented, whereby stability may be improved.

The graphite oxide may have a mechanical strength and an aspect ratio greater than those of the above-mentioned nano-clay.

Therefore, the protrusion of the hole injection layer 3 due to aging is effectively prevented, whereby the stability of the element may be improved.

In the organic light emitting diode according to the embodiment of the present invention, the protective layer 13 may include the nano-clay layer 12 or the graphite oxide layer 14 as described above. However, the protective layer is not limited thereto but may be formed by combining the polymer layer 11 or the above-mentioned layers.

Figure 4:
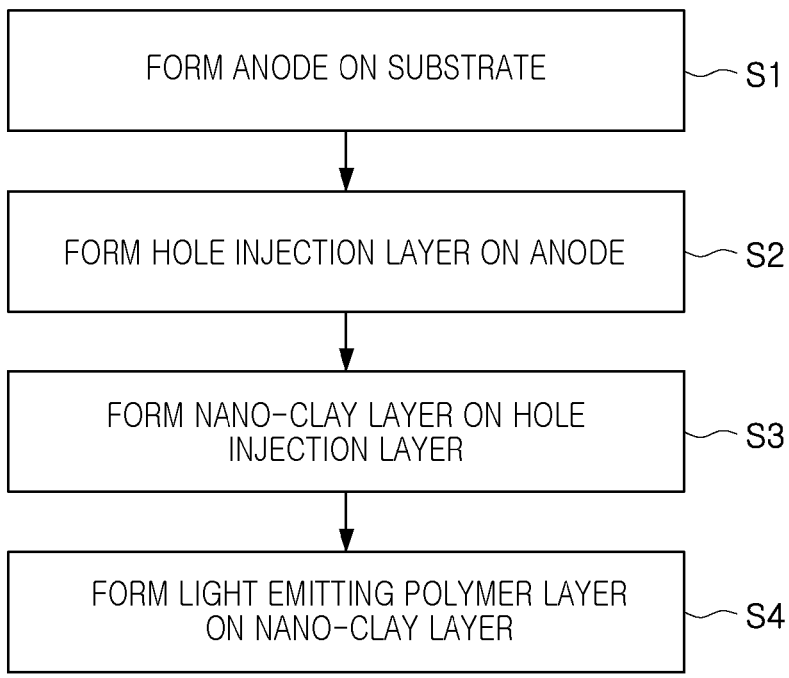
FIG. 4 is a flowchart showing a process of manufacturing an organic light emitting diode according to an embodiment of the present invention.

FIG. 4 is a flowchart showing a process of manufacturing an organic light emitting diode according to an embodiment of the present invention.

Figure 5:
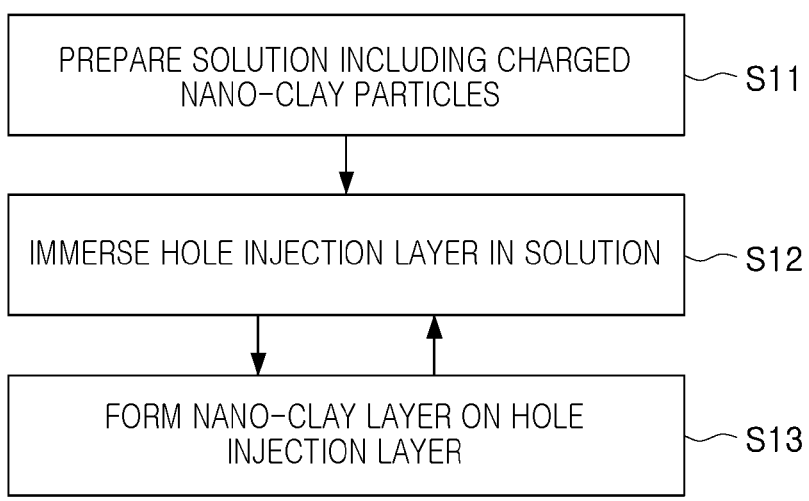
FIG. 5 is a flowchart showing a process of manufacturing a nano-clay layer of an organic light emitting diode according to a first embodiment of the present invention.

FIG. 5 is a flowchart showing a process of manufacturing a nano-clay layer of an organic light emitting diode according to a first embodiment of the present invention.

Figure 6:
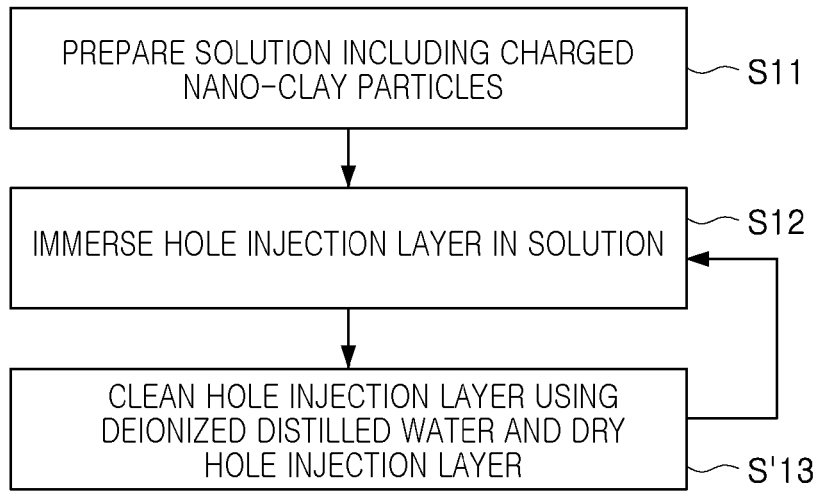
FIG. 6 is a flowchart showing a process of manufacturing a nano-clay layer of an organic light emitting diode according to a second embodiment of the present invention.

FIG. 6 is a flowchart showing a process of manufacturing a nano-clay layer of an organic light emitting diode according to a second embodiment of the present invention.

Figure 7:
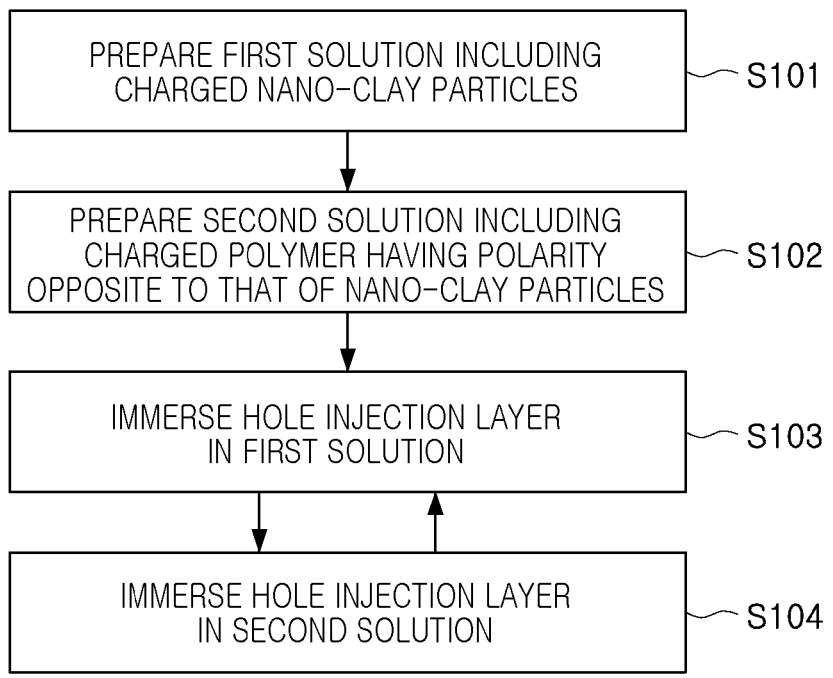
FIG. 7 is a flowchart showing a process of manufacturing a nano-clay layer of an organic light emitting diode according to a third embodiment of the present invention.

FIG. 7 is a flowchart showing a process of manufacturing a nano-clay layer of an organic light emitting diode according to a third embodiment of the present invention.

Figure 8:
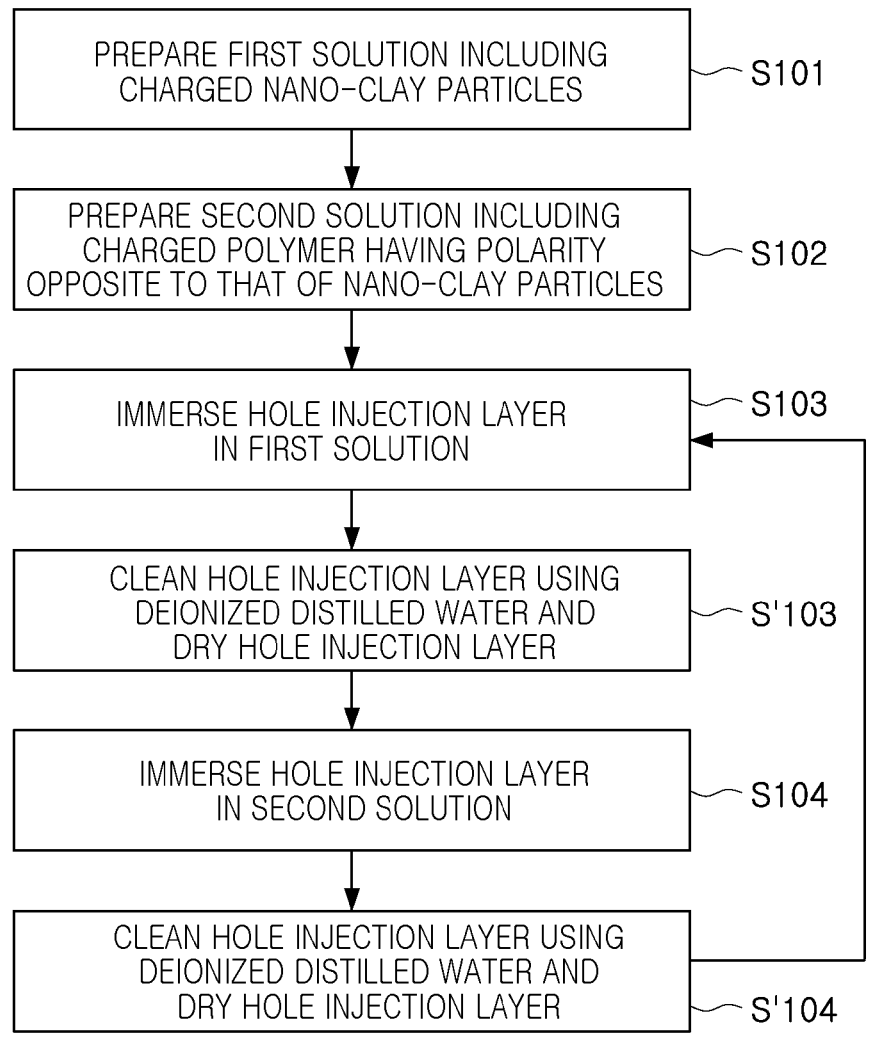
FIG. 8 is a flowchart showing a process of manufacturing a nano-clay layer of an organic light emitting diode according to a fourth embodiment of the present invention.

FIG. 8 is a flowchart showing a process of manufacturing a nano-clay layer of an organic light emitting diode according to a fourth embodiment of the present invention.

A method of manufacturing an organic light emitting diode according to an embodiment of the present invention may include forming an anode on a substrate; forming a protective layer on the anode, the protective layer having at least one inorganic material layer stacked therein and the inorganic material layer containing at least one of a nano-clay and a graphite oxide; and forming a light emitting polymer layer on the protective layer.

The method may further include forming a hole injection layer between the anode and the protective layer.

Referring to FIG. 4, a method of manufacturing an organic light emitting diode according to an embodiment of the present invention may include forming an anode on a substrate (S1); forming a hole injection layer on the anode (S2); forming a protective layer including at least one nano-clay layer on the hole injection layer (S3); and forming a light emitting polymer layer on the protective layer (S4).

The forming of the protective layer may include preparing a solution including charged nano-clay particles; and repeatedly immersing the anode in the solution to thereby form at least one nano-clay layer on the anode.

Referring to FIG. 5, in a method of manufacturing an organic light emitting diode according to an embodiment of the present invention, the forming of the protective layer may include preparing a solution including charged nano-clay particles (S11); and repeatedly immersing the hole injection layer in the solution (S12) to thereby form at least one nano-clay layer on the hole injection layer (S13).

Hereinafter, a method of manufacturing an organic light emitting diode according to an embodiment of the present invention will be described. However, a description of portions overlapped with the features of the organic light emitting diode described above will be omitted.

According to a method of manufacturing an organic light emitting diode according to an embodiment of the present invention, a solution including charged nano-clay particles is first prepared (S11).

Next, a hole injection layer is repeatedly immersed in the solution (S12), such that a nano-clay layer may be formed on the hole injection layer (S13).

Electrostatic attractive force is generated between the charged hole injection layer and the charged nano-clay particles through the operation of immersing the hole injection layer in the solution as described above, such that the nano-clay layer may be formed on the hole injection layer.

In addition, since the nano-clay layer is formed on the hole injection layer in a particle unit, an ultra-thin film nano-clay layer may be formed.

Therefore, the nano-clay layer made of an inorganic material may control the injection of the holes without completely blocking the movement of the holes.

In the method of manufacturing the organic light emitting diode according to the embodiment of the present invention, a process of immersing the anode in the solution including the nano-clay particles, cleaning the anode using deionized distilled water and drying the anode, and then reimmersing the anode in the solution may be repeated.

Referring to FIG. 6, in a method of manufacturing an organic light emitting diode according to an embodiment of the present invention, a process of immersing the hole injection layer in the solution including the nano-clay particles, cleaning the hole injection layer using deionized distilled water and drying the hole injection layer (S'13), and then reimmersing the hole injection layer in the solution may be repeated.

The above-mentioned process is performed to prevent excess materials from being formed on the nano-clay layer, whereby a nano-clay multi-layer thin film having an uniform thickness may be formed.

The forming of the protective layer may include alternately forming at least one nano-clay layer and at least one polymer layer.

Referring to FIG. 7, the forming of the protective layer may include preparing a first solution including charged nano-clay particles (S101); preparing a second solution including a charged polymer having a polarity opposite to that of the nano-clay particles (S102); and repeatedly immersing the hole injection layer in the first and second solutions in an alternating manner to thereby alternately form at least one nano-clay layer and polymer layer on the hole injection layer (S103 and S104).

The charged nano-clay layer and the charged polymer layer may have opposing polarities.

The first solution including the charged nano-clay particles may be first prepared (S101), and the second solution including the charged polymer having a polarity opposite to that of the nano-clay particles may be prepared (S102).

Then, the hole injection layer may be repeatedly immersed in the first and second solutions to thereby alternately format least one nano-clay layer and polymer layer on the hole injection layer (S103 and S104).

Therefore, the organic light emitting diode in which the nano-clay layer and the polymer layer may alternately formed on the hole injection layer may be manufactured.

Here, a sequence of forming the nano-clay layer and the polymer layer on the hole injection layer is not limited. That is, the polymer layer may be first formed on the hole injection layer or the nano-clay layer may be first formed thereon, according to an object of the present invention.

In addition, referring to FIG. 8, the repeatedly immersing of the hole injection layer in the solution may further include cleaning the hole injection layer using deionized distilled water and drying the hole injection layer (S'103 and S'104) after immersing a substrate in one solution and before immersing the substrate in another solution.

The hole injection layer is cleaned using the deionized distilled water and is dried to prevent excess materials from being added to the layer, whereby a nano-clay multi-layer thin film having an uniform thickness may be formed.

As set forth above, in an organic light emitting diode according to embodiments of the present invention, a nano-clay or graphite oxide multi-layer structure having a thickness in a nanometer scale is formed on a hole injection layer to control injection concentration of holes, whereby the performance of an element may be improved due to optimization of concentration of electrons and holes.

In addition, the nano-clay or the graphite oxide has a high aspect ratio and serves to block a path through which moisture or oxygen permeates into the element, whereby the stability of the element may be improved and the lifespan thereof may be increased.

Furthermore, the nano-clay layer or the graphite oxide layer prevents the hole injection layer from being protruded due to aging, whereby the stability of the element may be improved.

In a method of manufacturing an organic light emitting diode according to embodiments of the present invention, a multi-layer thin film may be formed only through a process of repeatedly immersing a charged hole injection layer in charged solutions having opposing polarities. Therefore, an expensive device is not required, such that economical efficiency is excellent.

In addition, the method of manufacturing the organic light emitting diode according to the embodiments of the present invention may facilitate the control of the thickness of the nano-clay layer or the graphite oxide layer.

While the present invention has been shown and described in connection with the embodiments, it will be apparent to those skilled in the art that modifications and variations can be made without departing from the spirit and scope of the invention as defined by the appended claims.

What is claimed is:

1. An organic light emitting diode comprising:
    an anode formed on a substrate;
    a protective layer formed on the anode and having at least one inorganic material layer stacked therein, the at least one inorganic material layer containing at least one of a nano-clay and a graphite oxide;
    a light emitting polymer layer formed on the protective layer;
    a cathode formed on the light emitting polymer layer; and
    a hole injection layer formed between the anode and the protective layer.

2. The organic light emitting diode of claim 1, wherein the hole injection layer contains poly(3,4-ethylenedioxythiophene).

3. The organic light emitting diode of claim 1, wherein the hole injection layer contains a water-soluble polymer.

4. The organic light emitting diode of claim 1, wherein the protective layer further includes at least one polymer layer formed alternately with the at least one inorganic material layer.

5. The organic light emitting diode of claim 1, wherein the protective layer has a thickness of 15 nm or less.

6. An organic light emitting diode comprising:
    an anode formed on a substrate;
    a protective layer formed on the anode and having at least one inorganic material layer stacked therein, the at least one inorganic material layer containing at least one of a nano-clay and a graphite oxide;
    a light emitting polymer layer formed on the protective layer; and
    a cathode formed on the light emitting polymer layer,
    wherein the nano-clay is a hydrate containing at least one material selected from a group consisting of sodium, calcium, aluminum, magnesium, a silicon oxide and a hydroxide.

7. The organic light emitting diode of claim 6, wherein the protective layer has a thickness of 15 nm or less.

8. The organic light emitting diode of claim 6, wherein the protective layer further includes at least one polymer layer formed alternately with the at least one inorganic material layer.

9. The organic light emitting diode of claim 8, wherein the at least one inorganic material layer and the at least one polymer layer have opposing polarities.

10. The organic light emitting diode of claim 8, wherein the protective layer has a thickness of 15 nm or less.

* * * * *